United States Patent [19]

Shigehara

[11] Patent Number: 5,420,528

[45] Date of Patent: May 30, 1995

[54] SEMICONDUCTOR INTEGRATED CIRCUIT HAVING A FUNCTION OF REDUCING A CONSUMED CURRENT

[75] Inventor: Hiroshi Shigehara, Tokyo, Japan

[73] Assignee: Kabushiki Kaisha Toshiba, Kawasaki, Japan

[21] Appl. No.: 237,897

[22] Filed: May 4, 1994

[30] Foreign Application Priority Data

May 6, 1993 [JP] Japan .................................. 5-105582

[51] Int. Cl.$^6$ ...................... H03K 19/096; H03K 3/01
[52] U.S. Cl. ...................................... 326/98; 327/544;
365/227; 365/156
[58] Field of Search ............... 365/190, 208, 227, 156;
326/17, 597.98; 327/544, 53

[56] References Cited

U.S. PATENT DOCUMENTS

| | | |
|---|---|---|
| 4,760,561 | 7/1988 | Yamamoto et al. . |
| 4,999,519 | 3/1991 | Kitsukawa et al. .................. 307/446 |
| 5,140,557 | 8/1992 | Yoshida . |
| 5,208,558 | 5/1993 | Shigehara et al. . |
| 5,324,992 | 6/1994 | Maly . |

FOREIGN PATENT DOCUMENTS

| | | |
|---|---|---|
| 0485200 | 5/1992 | European Pat. Off. . |
| 63-104443 | 5/1988 | Japan . |
| 2-105685 | 4/1990 | Japan . |
| 3-278741 | 12/1991 | Japan . |
| 5-27865 | 2/1993 | Japan . |

Primary Examiner—Edward P. Westin
Assistant Examiner—Jon Santamauro
Attorney, Agent, or Firm—Banner, Birch, McKie & Beckett

[57] ABSTRACT

An IC is divided into four circuit blocks. These four circuit blocks have the same function. While one of the circuit blocks is not functioning, a mode setting circuit generates mode control signals for selecting a mode in which the operation frequency of the circuit block is set lower than in a normal operation mode. A main control circuit controls the entire operation of the IC, and generates clock signals for defining the operations of the circuit blocks. Sub-control circuits are arranged so as to correspond to the circuit blocks and receive their respective mode control signals and clock signals. Upon receiving the mode control signals, the sub-control circuits controls their corresponding circuit blocks as to whether the circuit blocks are operated in the normal operation mode or at a frequency lower than that in the normal operation mode. In the normal operation mode, the sub-control circuits each set the amount of direct current of a direct current supply circuit arranged in its corresponding circuit block to a normal value, in response to the mode control signals. In the special operation mode, the sub-control circuits each make the amount of direct current smaller than in the normal operation mode.

19 Claims, 8 Drawing Sheets

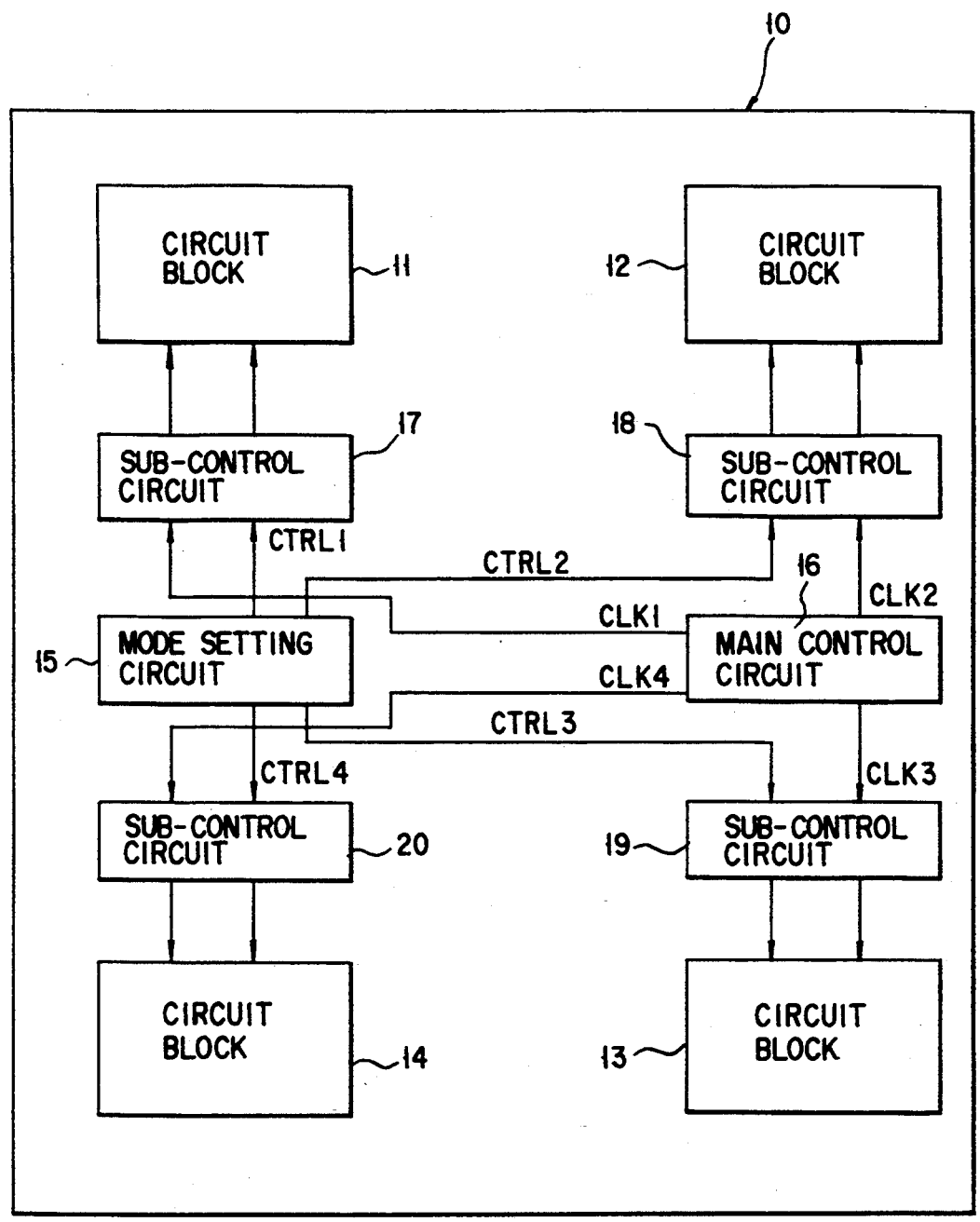
F I G. 2

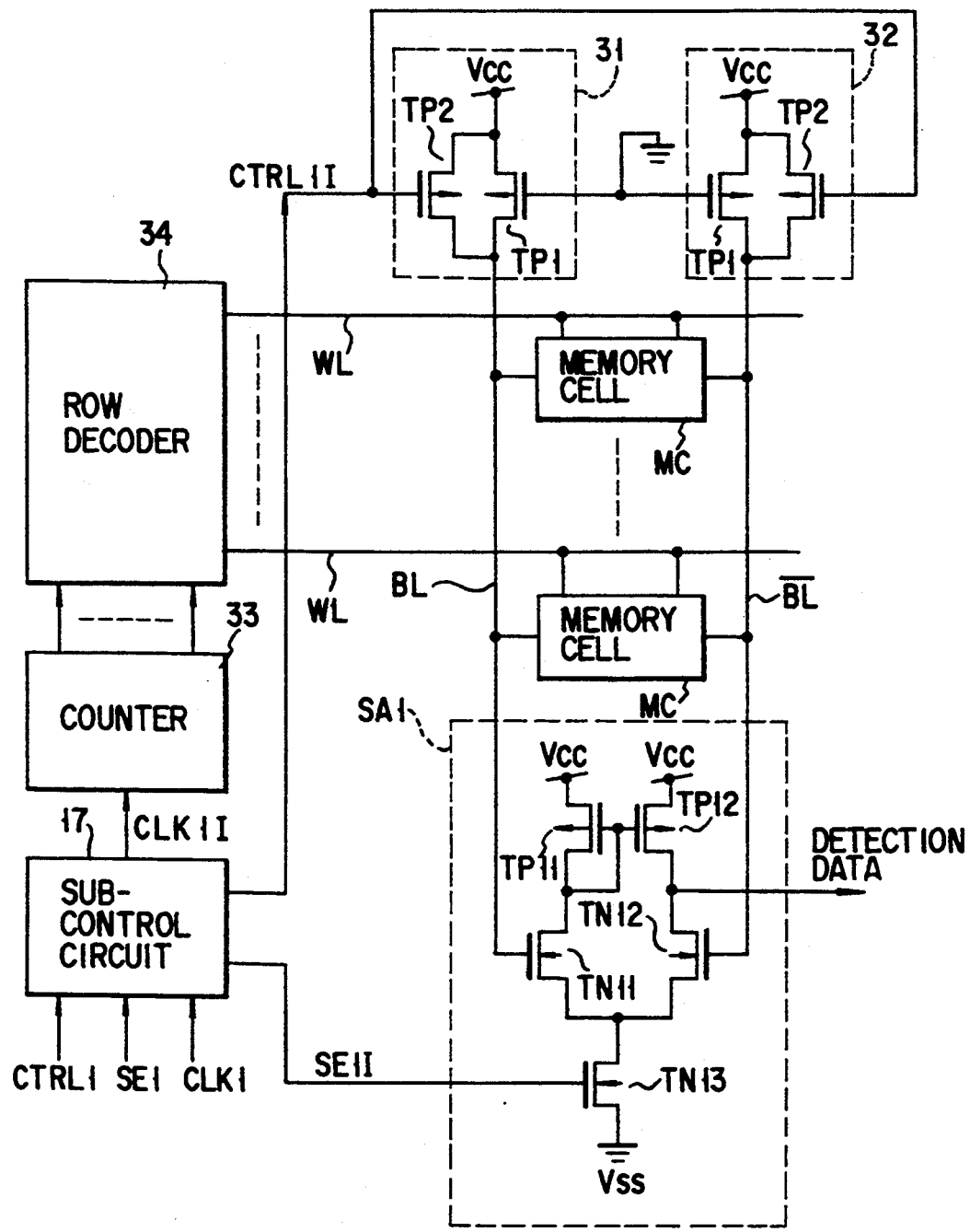
F I G. 3

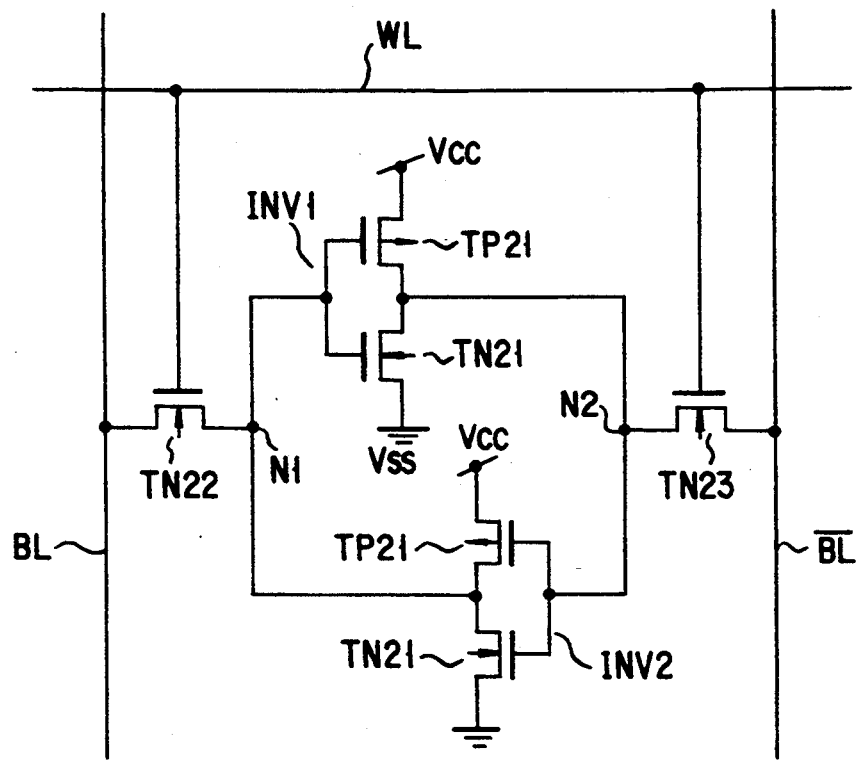
F I G. 4
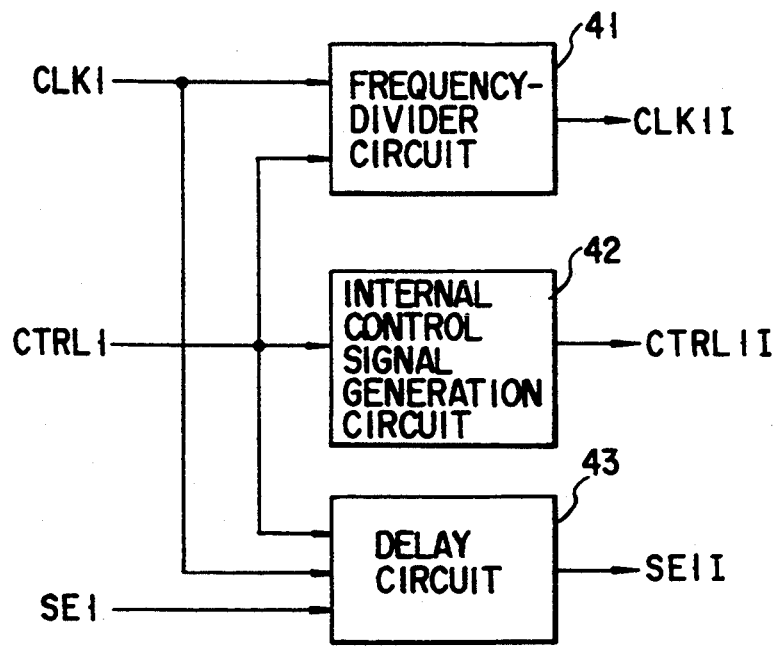
F I G. 5

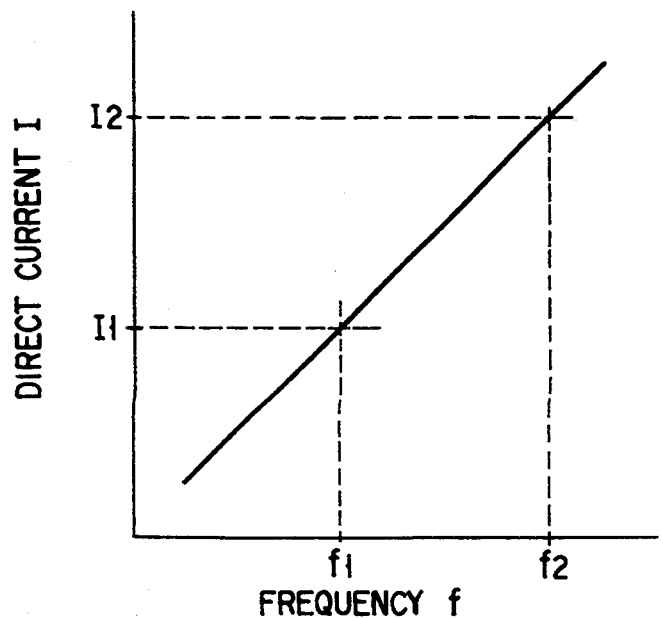
F I G. 6
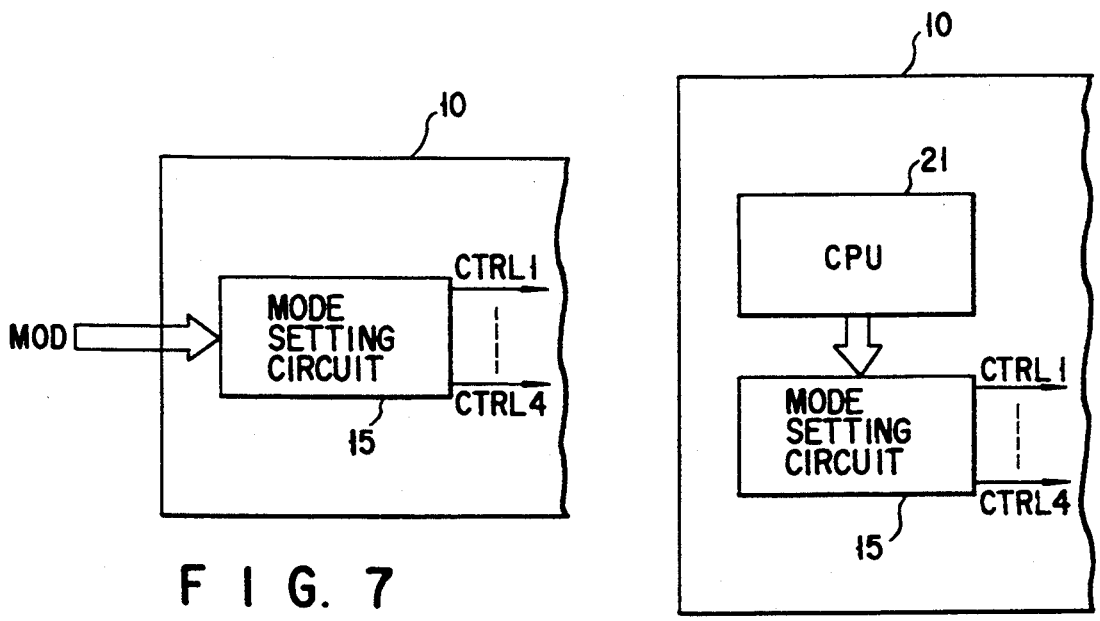
F I G. 7
F I G. 8

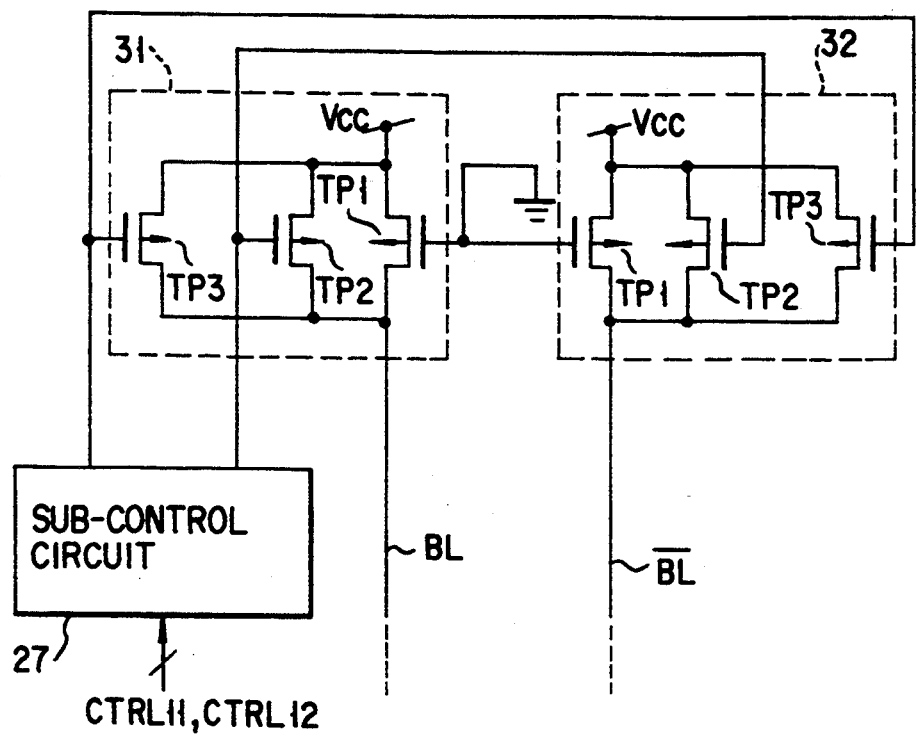
F I G. 9
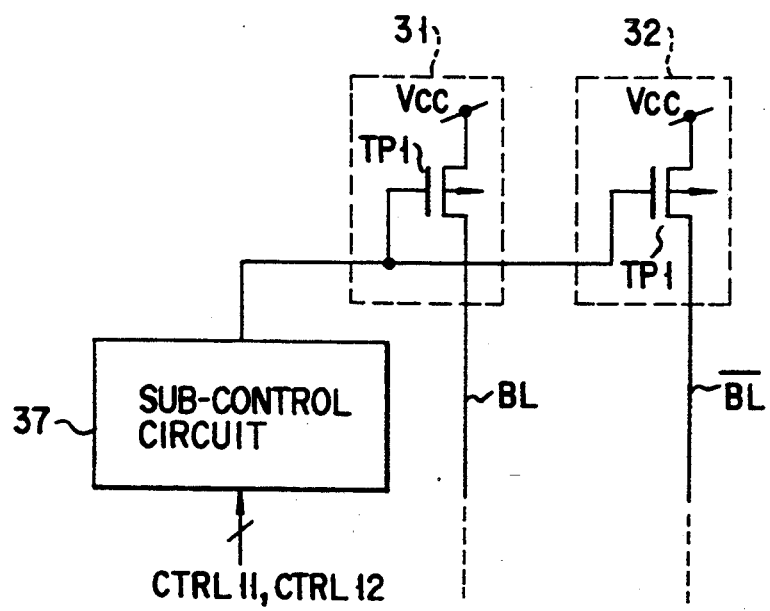
F I G. 10

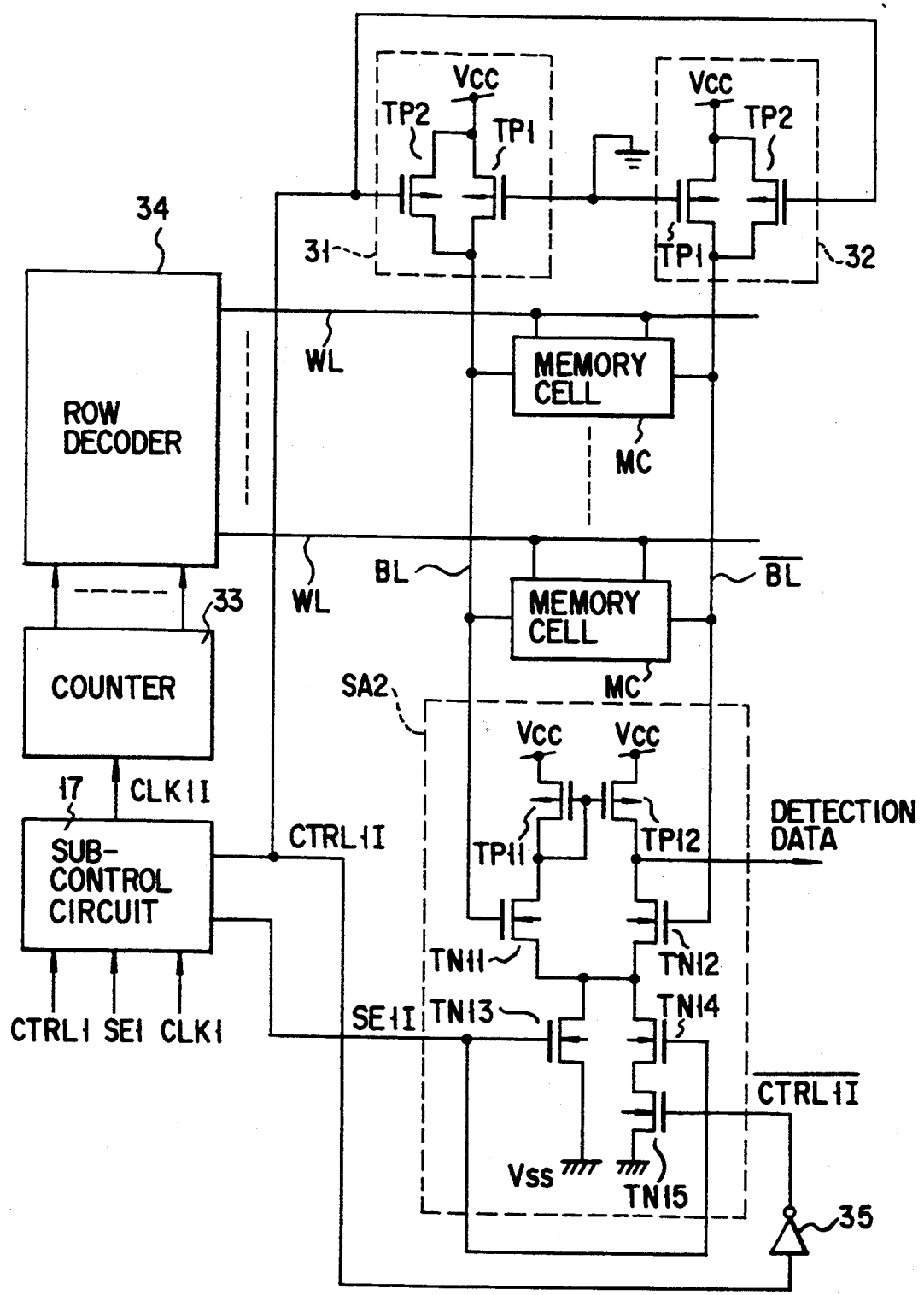
F I G. 11

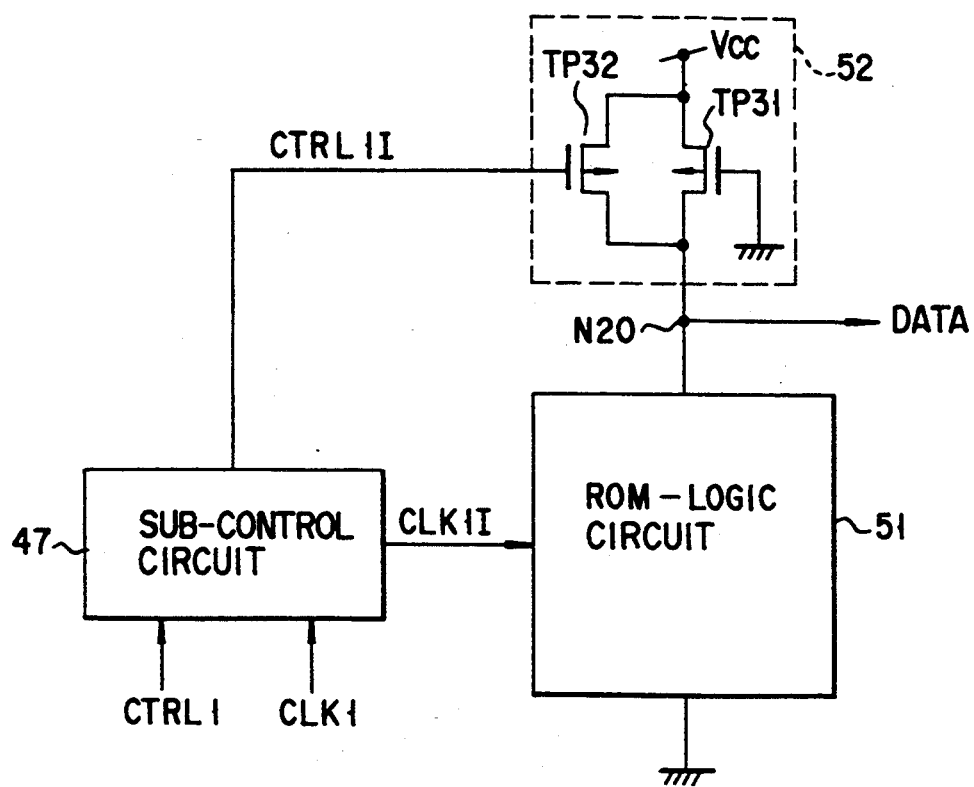
F I G. 12

SEMICONDUCTOR INTEGRATED CIRCUIT HAVING A FUNCTION OF REDUCING A CONSUMED CURRENT

BACKGROUND OF THE INVENTION

1. Field of the Invention

The present invention relates to a semiconductor integrated circuit having a function of reducing a consumed current and, more particularly, to a semiconductor integrated circuit having a function of setting the operation frequency of one of a plurality of circuit blocks lower than in a normal operation mode, while the circuit block is not functioning.

2. Description of the Related Art

In general, there are two methods for reducing power consumed by an LSI (large scale integrated circuit): One is to use a power save mode for decreasing the operation frequency in, for example, a waiting state, and the other is to set the frequency of a clock signal of one of a plurality of circuit blocks lower than in a normal operation mode, while the circuit block is not functioning. According to the latter method, the power (f×C×V:f=frequency, C=load capacity, v=power supply voltage) consumed by an alternating current due to the charge and discharge of a load capacity of the circuit block, is reduced.

To increase the operation speed of an LSI such as a memory LSI, a technique of constantly pulling up a bit line connected to a memory cell and decreasing a signal amplitude of the bit line when data is read out from the memory cell is known. FIG. 1 shows a circuit arrangement of one column of a memory LSI using this technique. As shown in FIG. 1, a number of memory cells, e.g., SRAM cells MC are connected between paired bit lines BL and $\overline{BL}$. A sense amplifier SA is also connected between these bit lines. P-channel MOS transistors TP for pulling up the bit lines are each connected between each of the bit lines and the node of each power supply Vcc. The gates of the MOS transistors TP are connected to the node of a ground Vss and biased so that the MOS transistors are always in an on-state.

When data is read out from the memory LSI, one of the SRAM cells MC is selected in response to a signal from a corresponding word line (not shown). In each of the SRAM cells MC, an N-channel MOS transistor in one of two CMOS inverters (not shown) is turned on, based on data stored in the SRAM cell. If a certain SRAM cell MC is selected, a current flows into the node of the ground Vss through one of the bit lines, for example, a bit line BL connected to the N-channel MOS transistor which is in the on-state in the selected SRAM cell, and the potential of the bit line BL reaches a low level. In this case, a direct current flows between the power supply Vcc and ground Vss via the bit line BL, and the low level of the bit line BL changes to an intermediate level between Vcc and Vss, in other words, the signal amplitude of the bit line BL is decreased. Therefore, the time required for pulling the potential of the bit line BL up to the power supply potential Vcc by the P-channel MOS transistor TP, in transition to a readout operation of subsequent data, can be shortened, with the result that a short access cycle can be achieved, i.e., a high-speed operation can be performed.

In the memory LSI shown in FIG. 1, when data is read out, a difference in potential caused between the bit lines BL and $\overline{BL}$ is amplified by the sense amplifier SA to generate detection data. The operation cycle of the sense amplifier SA is controlled by a sense enabling signal SE. The consumed current of the sense amplifier SA changes in accordance with a variation in the frequency of the signal SE. The consumed current of the memory LSI can thus be reduced by lowering the frequency of the sense enabling signal SE. However, the direct current flowing between Vcc and Vss through the bit line is not decreased simply by lowering the operation frequency, as described above. Since the cycle of a word line drive signal is synchronized with the sense enabling signal SE, if the operation frequency is lowered, the cycle of variations in the word line drive signal is lengthened and so is a period of time during which the direct current is flowing. If the sense amplifier SA is of a current mirror type as shown, a large direct current is required in order to achieve the high-speed operation. However, as described above, the direct current is not lessened even though the operation frequency is lowered.

If the operation frequency of a circuit is set lower than in a normal operation mode while the circuit is not functioning, the alternating current can be reduced, and the direct current cannot be reduced.

SUMMARY OF THE INVENTION

It is therefore an object of the present invention to provide a semiconductor integrated circuit having a consumed-current reducing function in which a direct current as well as an alternating current of one of a plurality of circuit blocks can be decreased while the circuit block is not functioning.

According to the present invention, there is provided a semiconductor integrated circuit having a function of reducing a consumed current, comprising:

a plurality of circuit blocks each having a direct current supply circuit;

mode setting means for generating a mode control signal for, while one of the plurality of circuit blocks is not functioning, setting an operation frequency of the one of the circuit blocks lower than in a normal operation mode; and control means for making an amount of direct current of the direct current supply circuit of the one of the circuit blocks smaller than in a normal operation mode, in response to the mode control signal generated from the mode setting means, and making the operation frequency of the one of the circuit blocks lower than in the normal operation mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a block diagram showing the entire constitution of a semiconductor integrated circuit of the present invention;

FIG. 3 is a circuit diagram showing part of a memory LSI according to a first embodiment of the present invention;

FIG. 4 is a circuit diagram of an SRAM cell incorporated in the memory LSI of FIG. 3;

FIG. 5 is a circuit diagram of a sub-control circuit incorporated in the memory LSI of FIG. 3;

FIG. 6 is a graph showing a relationship between the operation frequency and the amount of direct current of a direct current supply circuit in the memory LSI of FIG. 3;

FIG. 7 is a block diagram showing one method for inputting a control signal to control the operation of a mode setting circuit in the memory LSI of FIG. 3;

FIG. 8 is a block diagram showing another method for inputting a control signal to control the operation of the mode setting circuit in the memory LSI of FIG. 3;

FIG. 9 is a circuit diagram showing part of a memory LSI according to a second embodiment of the present invention;

FIG. 10 is a circuit diagram showing part of a memory LSI according to a third embodiment of the present invention;

FIG. 11 is a circuit diagram showing part of a memory LSI according to a fourth embodiment of the present invention; and FIG. 12 is a circuit diagram showing part of a memory LSI according to a fifth embodiment of the present invention.

DETAILED DESCRIPTION OF THE PREFERRED EMBODIMENTS

Figure 1:
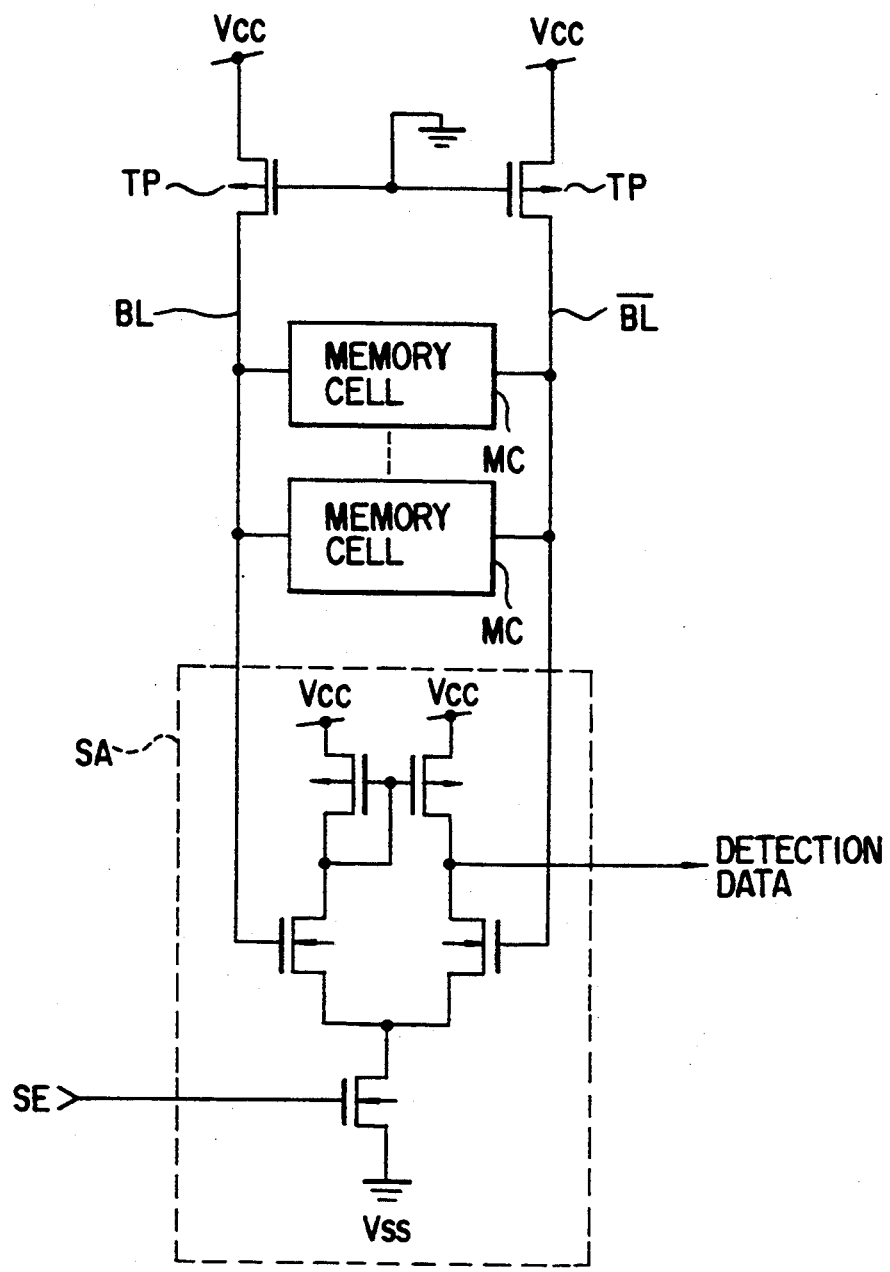
FIG. 1 is a circuit diagram showing part of a generally-used memory LSI.

Embodiments of the present invention will now be described, with reference to the accompanying drawings.

FIG. 2 is a block diagram showing the entire constitution of a semiconductor integrated circuit (IC) of the present invention. The IC, denoted by reference numeral 10, is divided into, for example, four circuit blocks 11 to 14. These four blocks have the same function. A mode setting circuit 15 outputs mode control signals CTRL1 to CTRL4 for setting the operation frequency of one of the four circuit blocks 11 to 14 lower than in a normal operation mode, while the circuit block is not functioning. A main control circuit 16 controls an operation of the entire circuit of the IC 10 and outputs clocks signals CLK1 to CLK4 for defining the operations of the circuit blocks 11 to 14. Sub-control circuits 17 to 20 are arranged correspondent to the circuit blocks 11 to 14, respectively, and receive their corresponding mode control signals CTRL1 to CTRL4 and clock signals CLK1 to CLK4. In response to the received mode control signals, each of the sub-control circuits 17 to 20 controls its corresponding circuit block as to whether it is operated in the normal operation mode or at a frequency lower than in the normal operation mode (in the special operation mode). Furthermore, in response to the mode control signals, each of the sub-control circuits 17 to 20 sets an amount of direct current of a direct current supply circuit provided in the circuit block to a normal value in the normal operation mode, and sets it smaller than in the normal operation mode in the special operation mode.

FIG. 3 is a circuit diagram showing one column of a memory LSI according to a first embodiment of the present invention when the memory LSI corresponds to the IC of FIG. 2. The memory LSI is divided into a plurality of circuit blocks, for example, four circuit blocks, as described above. FIG. 3 shows one of the circuit blocks 11 to which a mode control signal CTRL1 and a clock signal CLK 1 are supplied. A number of memory cells, e.g., a number of SRAM cells MC are connected between paired bit lines BL and $\overline{BL}$. A sense amplifier SA1 is connected to the bit lines BL and $\overline{BL}$. A first direct current supply circuit 31 serving as a bit line potential setting circuit is connected between one of the bit lines BL and the node of a power supply Vcc. Similarly, a second direct current supply circuit 32 serving as a bit line potential setting circuit is connected between the other bit line $\overline{BL}$ and the node of a power supply Vcc. Each of the first and second direct current supply circuits 31 and 32 is provided with P-channel MOS transistors TP1 and TP2 which function as current sources and whose source-to-drain paths are connected in parallel to each other. More specifically, the sources of the MOS transistors TP1 and TP2 of each current supply circuit are connected in common to the node of the power supply Vcc, and the drains thereof are connected in common to their corresponding bit line BL or $\overline{BL}$. The gates of the MOS transistors TP1 of the first and second direct current supply circuits 31 and 32 are both connected to the node of the ground Vss, and are biased so that the MOS transistors TP1 are always turned on. The gates of the MOS transistors TP2 of the circuits 31 and 32 are connected in common to each other. The sizes, e.g., the channel widths of the MOS transistors TP1 and TP2 can be the same or different.

The sense amplifier SA1 is of a well-known current mirror type, and includes two P-channel MOS transistors TP11 and TP12 constituting a current mirror load circuit, two N-channel MOS transistors TN11 and TN12 whose sources are connected in common and which constitute a differential pair, and an N-channel MOS transistor TN13 serving as a current source. While the gate of the N-channel MOS transistor TN11 is connected to the bit line BL, the gate of the N-channel MOS transistor TN12 is connected to the bit line $\overline{BL}$.

A sense enabling signal SE1 for controlling the operation of the sense amplifier SA1 is supplied to the sub-control circuit 17 to which the mode control signal CTRL1 and clock signal CLK1 are supplied. The sense enabling signal SE1 is one of four sense enabling signals SE1 to SE4 output from the main control circuit 16, and the signals SE2 to SE4 are supplied to their corresponding sub-control circuits 18 to 20. Upon reception of these signals, the sub-control circuit 17 outputs an internal mode control signal CTRL1I for controlling the operations of the first and second direct current supply circuits 31 and 32, an internal sense enabling signal SE1I for controlling the operation of the sense amplifier SA1, and an internal clock signal CLK1I. The control signal CTRL1I is input to the common gate of the MOS transistors TP2 of the first and second direct current supply circuits 31 and 32. The internal sense enabling signal SE1I is input to the gate of the N-channel MOS transistor TN13 of the sense amplifier SA1. The internal clock signal CLK1I is supplied to a counter 33. The counter 33 counts the internal clock signal CLK1I and outputs binary number count signals. The counter 33 can be replaced with a preset counter capable of presetting and resetting the counted values. The count signals output from the counter 33 are input to a row decoder 34. The row decoder 34 thus decodes the count signals. A plurality of word lines WL are selectively driven by the outputs of the row decoder 34. The word lines WL are connected to the SRAM cells MC.

FIG. 4 shows an arrangement of one of the SRAM cells MC. The SRAM cell MC includes two CMOS inverters INV1 and INV2 each having a P-channel MOS transistor TP21 and an N-channel MOS transistor TN21 and constituting a flip-flop circuit, an N-channel MOS transistor TN22, serving as a transfer gate, whose source-to-drain path is connected between the bit line BL and an output node N1 of the CMOS inverter INV2 which corresponds to one of output nodes of the flip-flop circuit, and an N-channel MOS transistor TN23, serving as a transfer gate, whose source-to-drain path is connected between the other bit line $\overline{BL}$ and an output node N2 of the CMOS inverter INV1 which corresponds to the other output node of the flip-flop circuit. The gates of the MOS transistors TN22 and TN23 are connected in common to the word line WL.

FIG. 5 shows an arrangement of the sub-control circuit 17. The sub-control circuit 17 includes a frequency-divider circuit 41, an internal control signal generation circuit 42, and a delay circuit 43. The frequency-divider circuit 41 divides the frequency of the clock signal CLK1 in response to the mode control signal CTRL1 to output an internal clock signal CLK1I having, for example, half of the frequency of the clock signal CLK1 or output the clock signal CLK1 itself as an internal clock signal CLK1I. The internal control signal generation circuit 42 outputs an internal mode control signal CTRL1I corresponding to the mode control signal CTRL1. The circuit 42 is able to output the mode control signal CTRL1 as it is and, in this case, a buffer circuit is used for the circuit 42. The delay circuit 43 delays the sense enabling signal SE1 based on the mode control signal CTRL1 to generate the internal sense enabling signal SE1I. This delay operation is controlled in synchronism with the clock signal CLK1.

In the normal operation mode of the memory LSI shown in FIG. 3, the mode control signal CTRL1 output from the mode setting circuit 15 is set to, for example, a low level, and the internal control signal generation circuit 42 of the sub-control circuit 17 outputs an internal mode control signal CTRL1I having the same level (low level) as that of the mode control signal CTRL1. In response to the internal mode control signal CTRL1I, the P-channel MOS transistors TP2 of the first and second direct current supply circuits 31 and 32 are turned on. As a result, a sufficient amount of direct currents flow through the bit lines BL and $\overline{BL}$ of the first and second direct current supply circuits 31 and 32.

Further, in the normal operation mode, the frequency-divider circuit 41 of the sub-control circuit 17 outputs an internal clock signal CLK1I having the same frequency as that of the clock signal CLK1 and, in this time, the counter 33 counts the internal clock signal CLK1I. Upon reception of the signal from the counter 33, the row decoder 34 outputs a drive signal for selecting a word line WL in sequence.

In the SRAM cell MC shown in FIG. 4, the N-channel MOS transistor TN21 of one of the inverters INV1 and INV2 is turned on in accordance with data stored in the SRAM cell. When the SRAM cell MC is accessed in response to a word line drive signal output from the row decoder 34, a current flows to the node of a ground Vss from the bit line connected to the N-channel MOS transistor TN21 which is in the on-state in one of the inverters INV1 and INV2 of the SRAM cell MC. For example, when the N-channel MOS transistor TN21 is turned on in the inverter INV2 of a selected SRAM cell MC, a direct current flows between the node of the power supply Vcc and that of the ground Vss through a series circuit of the first direct current supply circuit 31, bit line BL, N-channel MOS transistor TN22, node N1, and N-channel MOS transistor TN21 of the inverter INV2. Thus, the bit line BL is set to a low level. Since the direct current flows through the bit line BL, the low level of the bit line BL is changed to an intermediate level between Vcc and Vss, in other words, the signal amplitude of the bit line BL can be narrowed. Therefore, the time required for pulling the potential of the bit line BL up to the power supply potential Vcc by the first direct current supply circuit 31 in the transition to the next access cycle, can be shortened, with the result that a short access cycle is achieved and a high-speed memory operation is performed. Even when the N-channel MOS transistor TN21 is in the on-state in the inverter INV1 of the selected SRAM cell MC, if the SRAM cell MC is accessed in response to a word line drive signal from the row decoder 34, the low level of the bit line $\overline{BL}$ is changed to an intermediate level between Vcc and Vss. In this case, too, the time required for pulling the potential of the bit line $\overline{BL}$ up to the power supply potential Vcc by the second direct current supply circuit 32 in the transition to the next access cycle, can be shortened, with the result that a short access cycle is achieved and a high-speed memory operation is performed.

During a period of time during which the circuit shown in FIG. 3 is not used, that is, in a power save mode, the mode control signal CTRL1 output from the mode setting circuit 15 is set to a high level. Upon receiving the mode control signal CTRL1, the frequency-divider circuit 41 of the sub-control circuit 17 divides the clock signal CLK1 and outputs a signal having half of the frequency of the clock signal CLK1 as an internal clock signal CLK1I. After that, the counter 33 counts the internal clock signal CLK1I and outputs a count signal to the row decoder 34. Upon reception of the count signal, the row decoder 33 outputs a drive signal for selecting a word line WL in sequence, as in the above case. Since, however, the frequency of the internal clock signal CLK1I is low, the respective intervals at which the SRAM cells MC are accessed in sequence are longer in the power save mode than in the normal operation mode. As the frequency of the internal clock signal CLK1I is lowered, the delay circuit 43 of the sub-control circuit 17 delays the sense enabling signal SE1 so as to lengthen a period of time from when the memory cells starts to be accessed until the sense amplifier SA1 starts to operate. For this reason, the operation frequency is lowered even in the sense amplifier SA1 to which the internal sense enabling signal SE1I is input. Consequently, in the power save mode, the amount of alternating current flowing between each of the SRAM cell MCs and the sense amplifier SA1, is reduced.

In the power save mode, the internal control signal generation circuit 42 of the sub-control circuit 17 outputs an internal mode control signal CTRL1I having the same level (high level) as that of the mode control signal CTRL1. In response to the signal CTRL1I, the P-channel MOS transistors TP2 of the first and second direct current supply circuits 31 and 32 are turned off. In other words, in the power save mode, the amount of direct current flowing from the first and second direct current supply circuits 31 and 32 to the bit lines BL and $\overline{BL}$ is made smaller than in the normal operation mode. Thus, in the memory LSI shown in FIG. 3, the amount of direct current as well as the amount of alternating current is reduced.

According to the above embodiment, the frequency of the internal clock signal CLK1I in the power save mode is decreased to half of that in the normal operation mode and, in this case, the lower limit of a rate at which the amount of direct current supplied to the bit lines BL and $\overline{BL}$ from the first and second direct current supply circuits 31 and 32 is reduced, is half of that in the normal operation mode. As shown in FIG. 6, it is preferable that the frequency f of the internal clock signal CLK1I and the amount of direct current I of the first and second direct current supply circuits 31 and 32 be proportionate to each other. When the frequency f2 of the internal clock signal CLK1I in the normal operation mode is reduced to half (frequency f1) in the power save mode, it is preferable that the amount of direct current I2 in the normal operation mode be cut to half (amount of direct current I1) in the power save mode. It is therefore preferable that the channel width of each P-channel MOS transistor TP2 of the first and second direct current supply circuits 31 and 32 be equal to or smaller than that of each P-channel MOS transistor TP1 of the circuits 31 and 32.

FIGS. 7 and 8 each show a method of inputting a control signal for controlling an operation of the mode setting circuit 15. According to the method shown in FIG. 7, a mode setting signal MOD is input to the mode setting circuit 15 from outside the IC 10. According to the method shown in FIG. 8, a mode setting signal is generated from a CPU 21 provided in an IC 10.

FIG. 9 is a circuit arrangement of part of a memory LSI according to a second embodiment of the present invention. In this memory LSI, the first and second direct current supply circuits 31 and 32 each include three P-channel MOS transistors TP1, TP2 and TP3. The sources of the three transistors are connected in common to the node of a power supply Vcc, and the drains thereof are connected in common to the bit line BL or $\overline{BL}$. The gates of the P-channel MOS transistors TP1 are connected to the node of the ground Vss, and are biased such that both the transistors TP1 are always in the on-state. The gates of the P-channel MOS transistors TP2 are connected to each other, as are the gates of the P-channel MOS transistors TP3. In the second embodiment, another sub-control circuit 27 is substituted for the above-described sub-control circuit 17. The sub-control circuit 27 is supplied with two-bit mode control signals CTRL11 and CTRL12 in place of the mode control signal CTRL1 output from the main control circuit 16. In response to the signals CTRL11 and CTRL12, the sub-control circuit 27 generates control signals for turning on/off the P-channel MOS transistors TP2 and TP3 independently of each other in each of the first and second direct current supply circuits 31 and 32.

According to the first embodiment shown in FIG. 3, a mode control signal for decreasing the operation frequency of an unused one of the circuit blocks is output from the mode setting circuit 15, and one P-channel MOS transistor TP2 of each of the first and second direct current supply circuits 31 and 32 is turned on/off in response to the mode control signal. In contrast, according to the second embodiment shown in FIG. 9, the mode setting circuit 15 is modified such that a plurality of mode control signals (of two bits) are output in accordance with the operation frequency of an unused circuit block, and two P-channel MOS transistors TP2 and TP3 of each of the first and second direct current supply circuits 31 and 32 are controlled separately from each other. In the second embodiment, therefore, the amount of direct current of the first and second direct current supply circuits 31 and 32 can be controlled at three stages, and the optimum power management can be performed in accordance with the operation frequency.

FIG. 10 is a circuit arrangement showing part of a memory LSI according to a third embodiment of the present invention. In this memory LSI, the first and second direct current supply circuits 31 and 32 are each constituted by a single P-channel MOS transistor TP1. The source of the MOS transistor TP1 is connected to the node of a power supply Vcc, and the drain thereof is connected to the bit line BL or $\overline{BL}$. The gates of the MOS transistors TP1 of the circuits 31 and 32 are connected to a common node. In the third embodiment, another sub-control circuit 37 is substituted for the foregoing sub-control circuit 17. The sub-control circuit 37 is supplied with, for example, two-bit mode control signals CTRL11 and CTRL12, in place of the mode control signal CTRL1 output from the main control circuit 16. The sub-control circuit 37 then outputs control signals having voltages corresponding to the mode control signals CTRL11 and CTRL12. These control signals are supplied to the common node of the gates of both the MOS transistors TP1.

According to the third embodiment, the mode setting circuit 15 is modified so as to output a plurality of mode control signals (of two bits) corresponding to the operation frequency of an unused one of the circuit blocks, and the gate potential of one P-channel MOS transistor TP1 of each of the first and second direct current supply circuits 31 and 32 is controlled. Consequently, the amount of current of the first and second direct current supply circuits 31 and 32 can be controlled at a plurality of stages (four stages in this embodiment), and the optimum power management can be performed in accordance with the operation frequency.

In both the second and third embodiments, it is desirable that the lower limit of a rate at which the amount of direct current of the first and second direct current supply circuits 31 and 32 is reduced in the power save mode should coincide with that of a rate at which operation frequency is lowered.

For example, in the third embodiment of FIG. 3, the gates of the P-channel MOS transistors TP1 are biased such that the transistors are always in the on-state. If, however, the operation frequency is considerably low in the power save mode, the gates of the MOS transistors TP1 can be controlled such that the MOS transistors TP1 are turned off. More specifically, a direct current cannot be always caused to flow through the P-channel MOS transistor TP1, or the gates can be controlled such that the amount of direct current becomes zero in the power save mode.

FIG. 11 is a circuit arrangement showing one column of a memory LSI according to a fourth embodiment of the present invention. This memory LSI differs from that of FIG. 3 only in a sense amplifier SA2 having an internal structure other than that of the sense amplifier SA1 shown in FIG. 3. In FIG. 11, the same components as those in FIG. 3 are denoted by the same reference numerals. The sense amplifier SA2 includes two P-channel MOS transistors TP11 and TP12 and five N-channel MOS transistors TN11 to TN15. The N-channel MOS transistors TN14 and TN15, which are added to the sense amplifier SA1 shown in FIG. 3, are connected in series between a common source of the N-channel MOS transistors TN11 and TN12 and the node of a ground Vss. The gate of the MOS transistor TN14 is supplied with an internal sense enabling signal SE1I, and the gate of the MOS transistor TN15 is supplied with a control signal CTRL1I through an inverter 35. In other words, an inverted signal $\overline{CTRL1I}$ of the control signal CTRL1I is supplied to the gate of the MOS transistor TN15.

An operation of the memory LSI shown in FIG. 11, which is different from that of the memory LSI shown in FIG. 3, will now be described. The MOS transistors TN13 and TN14 are so controlled that they are turned on when the internal sense enabling signal SE1I is activated (set to a high level). Since, in the normal operation mode, the control signal CTRL1I becomes inactive (a low level) and the output of the inverter 35 is set to a high level, the MOS transistor TN15 is turned on to form a current path of the MOS transistors TN14 and TN15. In contrast, since, in the power save mode, the control signal CTRL1I is activated (set to a high level) and the output of the inverter 35 becomes a low level, the MOS transistor TN15 is turned off, and the current path of the MOS transistors TN14 and TN15 is cut off. According to the fourth embodiment, in the power save mode, the operation frequency of the sense amplifier SA2 is decreased, as is the amount of direct current.

The above embodiments show examples of memory LSIs. The present invention is not limited to a memory LSI but can be applied to another LSI such as a logic LSI incorporating a direct current supply circuit.

FIG. 12 is a circuit diagram showing a memory LSI according to a fifth embodiment of the present invention. This figure shows an internal structure of the circuit block 11 of the IC 10 shown in FIG. 2 when the IC serves as a ROM. In this circuit block, a sub-control circuit 47 receives a mode control signal CTRL1 and a clock signal CLK1 and outputs an internal mode control signal CTRL1I and an internal clock signal CLK1I, and a ROM-Logic circuit 51 previously charges a data output node N20 with a direct current to have a predetermined potential, selects a ROM cell therefrom during the readout of data, and determines whether the node N20 is to be discharged or to remain charged based on data stored in the selected ROM cell. Operations of the ROM-Logic circuit 51 for selecting data and discharging the node N20 are controlled in synchronism with the internal clock signal CLK1I. A direct current supply circuit 52 is connected to the node N20 and includes, for example, two P-channel MOS transistors TP31 and TP32. These MOS transistors TP31 and TP32 are connected in parallel between the node of a power supply Vcc and node N20. The gate of a MOS transistor TP31 is connected to that of a ground Vss and biased so that the transistor TP31 is always in the on-state. The gate of a MOS transistor TP32 is supplied with an internal mode control signal CTRL1I from the sub-control circuit 47. The sizes, e.g., the channel widths of the MOS transistors TP1 and TP2 can be the same or different.

In the normal operation mode of the memory LSI shown in FIG. 12, the internal mode control signal output from the sub-control circuit 47 is set to a low level, and the P-channel MOS transistor TP32 of the direct current supply circuit 52 is turned on in response to the internal mode control signal CTRL1I. In this time, a sufficient amount of currents flow through the node N20 of the direct current supply circuit 52. Therefore, the time required for pulling the potential of the node N20 up to the power supply potential Vcc by the direct current supply circuit 52 in the transition to the subsequent access cycle, can be shortened, with the result that a short access cycle is achieved and a high-speed memory operation is performed.

During a period of time during which the circuit shown in FIG. 12 is not used, that is, in the power save mode, the internal mode control signal CTRL1I output from the sub-control circuit 47 is set to a high level. Upon receiving the signal CTRL1I, the P-channel MOS transistor TP32 of the direct current supply circuit 52 is turned off. In other words, the amount of direct current supplied to the node N20 from the direct current supply circuit 52 in the power save mode is made smaller than in the normal operation mode. Since, in the power save mode, the frequency of the internal clock signal CLK1I output from the sub-control circuit 47 is lowered, the amount of alternating current flowing through the ROM-Logic circuit 51 is reduced.

According to the semiconductor integrated circuit of the present invention, as described above, while one of circuit blocks is not functioning, the direct current as well as the alternating current flowing through the one of circuit blocks can be decreased, and the optimum power management can be performed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit having a function of reducing a consumed current, comprising:
   a plurality of circuit blocks each having a direct current supply circuit;
   mode setting means for generating a mode control signal for, while one of said plurality of circuit blocks is not functioning, setting an operation frequency of said one of the circuit blocks lower than in a normal operation mode; and
   control means for making an amount of direct current of the direct current supply circuit of said one of the circuit blocks smaller than in a normal operation mode, in response to the mode control signal generated from said mode setting means, and making the operation frequency of said one of the circuit blocks lower than in the normal operation mode.

2. The circuit according to claim 1, wherein said control means controls the circuit such that a lower limit of a rate at which the amount of direct current of the direct current supply circuit of said one of the circuit blocks is decreased coincides with a lower limit of a rate at which the operation frequency of said one of the circuit blocks is lowered.

3. The circuit according to claim 1, wherein said direct current supply circuit includes a plurality of current sources, and said control means selectively turns on and turns off the current sources in response to the mode control signal.

4. The circuit according to claim 3, wherein said mode setting means outputs mode control signals corresponding to the operation frequency of said one of the circuit blocks, and said control means selectively turns on and turns off said current sources in response to the mode control signals corresponding to the operation frequency, thereby controlling the amount of current of the direct current supply circuit at a plurality of stages.

5. The circuit according to claim 3, wherein said plurality of current sources are each constituted by a P-channel MOS transistor.

6. The circuit according to claim 1, wherein said direct current supply circuit includes a single current source.

7. The circuit according to claim 6, wherein said mode setting means outputs mode control signals corresponding to the operation frequency of said one of the circuit blocks, and said control means controls a voltage value of a current control signal for determining the amount of current of the direct current supply circuit in response to the mode control signals corresponding to the operation frequency.

8. The circuit according to claim 6, wherein said single current source is constituted by a P-channel MOS transistor.

9. The circuit according to claim 6, wherein said control means controls a voltage value of the current control signal at a plurality of stages in response to the mode control signals corresponding to the frequency operation, and controls the amount of current of the direct current supply circuit at a plurality of stages.

10. The circuit according to claim 1, wherein said control means includes:
a first control circuit for receiving a first clock signal and the mode control signal, and outputting one of the first clock signal or a second clock signal whose frequency is lower than a frequency of the first clock signal in response to the mode control signal;
a second control circuit for receiving the mode control signal, and outputting a current control signal for controlling an operation of the direct current supply circuit in response to the mode control signal; and
a third control circuit for receiving the mode control signal and an activation control signal for activating an operation of each of the circuit blocks, and delaying and outputting the activation control signal in response to the mode control signal.

11. The circuit according to claim 1, wherein each of said plurality of circuit blocks is a memory circuit block including memory cells, bit lines, and a sense amplifier, and said direct current supply circuits are bit line potential setting circuits for setting potentials of the bit lines to predetermined values.

12. The circuit according to claim 11, wherein said direct current supply circuits each include a plurality of current sources, and said control means selectively turns on and turns off the current sources in response to the mode control signal.

13. The circuit according to claim 12, wherein said current sources are each constituted by a P-channel MOS transistor.

14. The circuit according to claim 1, wherein said plurality of circuit blocks each include a ROM-Logic circuit block operated in synchronism with a clock signal, said ROM-Logic circuit block having a data readout node, and said direct current supply circuit supplies a current to the data readout node of said ROM-Logic circuit block and sets a potential of the data readout node to a predetermined value.

15. The circuit according to claim 14, wherein said direct current supply circuit includes a plurality of current sources, and said control means selectively turns on and turns off the current sources in response to the mode control signal.

16. The circuit according to claim 15, wherein said current sources are each constituted by a P-channel MOS transistor.

17. A semiconductor integrated circuit having a function of reducing a consumed current, comprising:
a plurality of circuit blocks each having a direct current supply circuit;
mode setting means for generating a mode control signal for, while one of said plurality of circuit blocks is not functioning, setting a consumed current of said one of the circuit blocks lower than in a normal operation mode; and
control means for making an amount of direct current of the direct current supply circuit of said one of the circuit blocks smaller than in a normal operation mode, in response to the mode control signal generated from said mode setting means, and making the operation frequency of said one of the circuit blocks lower than in the normal operation mode.

18. The circuit according to claim 17, wherein said direct current supply circuit includes a plurality of current sources, and said control means selectively turns on and turns off the current sources in response to the mode control signal.

19. The circuit according to claim 17, wherein said direct current supply circuit includes a single current source, and said control means controls a voltage value of a current control signal for determining the amount of current of the direct current supply circuit in response to the mode control signal and controls an operation of the current source in response to the current control signal.

* * * * *